(12) United States Patent
Xiong et al.

(10) Patent No.: US 12,720,703 B2
(45) Date of Patent: Aug. 25, 2026

(54) CABINET SERVER

(71) Applicant: xFusion Digital Technologies Co., Ltd., Zhengzhou (CN)

(72) Inventors: Xing Xiong, Zhengzhou (CN); Hongjun Hu, Zhengzhou (CN)

(73) Assignee: xFusion Digital Technologies Co., Ltd., Zhengzhou (CN)

( * ) Notice: Subject to any disclaimer, the term of this patent is extended or adjusted under 35 U.S.C. 154(b) by 83 days.

(21) Appl. No.: 18/962,299

(22) Filed: Nov. 27, 2024

(65) Prior Publication Data

US 2025/0098103 A1 Mar. 20, 2025

Related U.S. Application Data

(63) Continuation of application No. PCT/CN2023/097838, filed on Jun. 1, 2023.

(30) Foreign Application Priority Data

Sep. 24, 2022 (CN) ......................... 202211168653.1

(51) Int. Cl.
*H05K 7/14* (2006.01)

(52) U.S. Cl.
CPC .................................. *H05K 7/1492* (2013.01)

(58) Field of Classification Search
CPC .................................................... H05K 7/1492
USPC ............................................................ 307/43
See application file for complete search history.

(56) References Cited

U.S. PATENT DOCUMENTS 6,148,352 A * 11/2000 Coale ................... G11B 33/126
7,379,305 B2 * 5/2008 Briggs ................. H05K 7/1424 361/727
7,773,385 B2 * 8/2010 Belady .................... G06F 1/189 361/727

(Continued)

FOREIGN PATENT DOCUMENTS

CN 101957651 A 1/2011
CN 105305600 A 2/2016

(Continued)

OTHER PUBLICATIONS

International Search Report for International application No. PCT/CN2023/097838 filed Jun. 1, 2023, Mail Date: Aug. 7, 2023, English + Original documents, 7 pages.

*Primary Examiner* — Alfonso Perez Borroto
(74) *Attorney, Agent, or Firm* — WOMBLE BOND DICKINSON (US) LLP

(57) ABSTRACT

A cabinet server includes a power module, at least one direct-current device, at least one alternating-current device, a direct-current power module, and an alternating-current power module. When the direct-current power module is inserted into the power module, the direct-current power module is connected to the at least one direct-current device by using the power module, and the direct-current power module is configured to provide a first direct-current voltage to the at least one direct-current device. When the alternating-current power module is inserted into the power module, the alternating-current power module is connected to the at least one alternating-current device by using the power module, and the alternating-current power module is configured to provide a second alternating-current voltage to the at least one alternating-current device.

20 Claims, 6 Drawing Sheets

(56) References Cited

U.S. PATENT DOCUMENTS

| | | | | |
|---|---|---|---|---|
| 9,312,745 | B2 * | 4/2016 | Chen | G06F 1/188 |
| 9,377,832 | B1 | 6/2016 | Heydari Monfared | |
| 10,521,001 | B2 * | 12/2019 | Wilcox | G06F 1/188 |
| 10,895,896 | B1 | 1/2021 | Macgregor | |
| 12,034,279 | B2 | 7/2024 | Ma et al. | |
| 2004/0228090 | A1 | 11/2004 | Blackwell | |
| 2014/0215230 | A1 * | 7/2014 | Chang | G06F 1/26 713/300 |
| 2014/0247540 | A1 | 9/2014 | Steeves et al. | |
| 2017/0212565 | A1 * | 7/2017 | Chen | G06F 1/26 |

FOREIGN PATENT DOCUMENTS

| | | | |
|---|---|---|---|
| CN | 107479645 | A | 12/2017 |
| CN | 215646209 | U | 1/2022 |
| CN | 115686143 | A | 2/2023 |
| KR | 20110055997 | A | 5/2011 |
| WO | 2021163933 | A1 | 8/2021 |

* cited by examiner

CABINET SERVER

CROSS-REFERENCE TO RELATED APPLICATIONS

This application is a continuation of International Application No. PCT/CN2023/097838, filed on Jun. 1, 2023, which claims priority to Chinese Patent Application No. 202211168653.1, filed on Sep. 24, 2022. The disclosures of the aforementioned applications are hereby incorporated by reference in their entireties.

TECHNICAL FIELD

This application relates to the field of computer technologies, and in particular, to a cabinet server.

BACKGROUND

With popularization of technologies such as computing, big data, and artificial intelligence, high-density cluster computing is developed. Deployment of a large-scale data center has increasingly high requirements for deployment efficiency and server density, and conventional rack server deployment cannot meet the requirement. Centralized cabinet server deployment is increasingly favored. A power supply voltage interface, a power supply capability, and server density of a cabinet server also become important specifications for server design. However, an existing cabinet server can provide only a single power supply, resulting in low effective utilization of a space of the cabinet server, poor compatibility, and high costs of overall power supply deployment.

SUMMARY

Embodiments of this application provide a cabinet server, to compatibly supply power to a direct-current device and an alternating-current device. Therefore, device versatility in the cabinet server is enhanced, and deployment costs of the cabinet server are reduced.

According to a first aspect, an embodiment of this application provides a cabinet server. The cabinet server includes a power module, at least one direct-current device, at least one alternating-current device, a direct-current power module, and an alternating-current power module. The power module is configured for the direct-current power module and/or the alternating-current power module to be inserted, and the power module is configured to receive a three-phase alternating-current voltage input from the outside of the cabinet server, and output a first alternating-current voltage to the direct-current power module and/or the alternating-current power module. When the direct-current power module is inserted into the power module, the direct-current power module is connected to the at least one direct-current device by using the power module, and the direct-current power module is configured to provide a first direct-current voltage to the at least one direct-current device. When the alternating-current power module is inserted into the power module, the alternating-current power module is connected to the at least one alternating-current device by using the power module, and the alternating-current power module is configured to provide a second alternating-current voltage to the at least one alternating-current device.

The cabinet server is compatible with the direct-current power module or the alternating-current power module, so that power is compatibly supplied to the direct-current device and the alternating-current device. Therefore, device versatility in the cabinet server is enhanced, effective utilization of a space of the cabinet server is improved, deployment costs of the cabinet server are reduced, and flexible adaptability of the cabinet server is improved.

In an embodiment, the power module includes a plurality of slots, and each slot is configured for the direct-current power module or the alternating-current power module to be inserted; when the direct-current power module is inserted into one of the slots in the power module, an output terminal of the direct-current power module is connected to the at least one direct-current device by using the slot; when the alternating-current power module is inserted into one of the slots in the power module, an output terminal of the alternating-current power module is connected to the at least one alternating-current device by using the slot. The cabinet server is compatible with the direct-current power module or the alternating-current power module by using the plurality of slots of the power module. Therefore, device versatility in the cabinet server is enhanced, effective utilization of a space of the cabinet server is improved, deployment costs of the cabinet server are reduced, and flexible adaptability of the cabinet server is improved.

In an embodiment, at least one of the slots in the power module includes a first alternating-current output connector, a first alternating-current input connector, and a first direct-current output connector; when the direct-current power module is inserted into the slot in the power module, both the first alternating-current input connector and the first direct-current output connector are connected to the direct-current power module; when the alternating-current power module is inserted into the slot in the power module, both the first alternating-current output connector and the first alternating-current input connector are connected to the alternating-current power module. The cabinet server is compatible with the direct-current power module or the alternating-current power module by using the first alternating-current output connector, the first alternating-current input connector, and the first direct-current output connector in the slot. Therefore, device versatility in the cabinet server is enhanced, effective utilization of a space of the cabinet server is improved, deployment costs of the cabinet server are reduced, and flexible adaptability of the cabinet server is improved.

In an embodiment, at least one of the slots in the power module includes a first alternating-current input connector and a first direct-current output connector; when the direct-current power module is inserted into the slot in the power module, both the first alternating-current input connector and the first direct-current output connector are connected to the direct-current power module; when the alternating-current power module is inserted into the slot in the power module, the first alternating-current input connector is connected to the alternating-current power module. The cabinet server is compatible with the direct-current power module or the alternating-current power module by using the first alternating-current input connector and the first direct-current output connector in the slot. Therefore, device versatility in the cabinet server is enhanced, effective utilization of a space of the cabinet server is improved, deployment costs of the cabinet server are reduced, and flexible adaptability of the cabinet server is improved.

In an embodiment, the direct-current power module includes a second direct-current output connector, a second alternating-current input connector, and a voltage conversion module; the second alternating-current input connector is connected to the first alternating-current input connector, and is configured to receive the first alternating-current voltage through the first alternating-current input connector; the voltage conversion module is connected to the second alternating-current input connector and the second direct-current output connector, and is configured to convert the first alternating-current voltage into the first direct-current voltage; and the second direct-current output connector is connected to the at least one direct-current device by using the first direct-current output connector, and is configured to output the first direct-current voltage to the at least one direct-current device through the first direct-current output connector. The direct-current power module converts a voltage by using the voltage conversion module, and is connected to the slot in the power module by using the second direct-current output connector and the second alternating-current input connector, so that the cabinet server is compatible with the direct-current power module. Therefore, flexible adaptability of the cabinet server is improved.

In an embodiment, the alternating-current power module includes a third alternating-current input connector, a third alternating-current output connector, and a voltage pass-through module; the third alternating-current input connector is connected to the first alternating-current input connector, and is configured to receive the first alternating-current voltage through the first alternating-current input connector; the voltage pass-through module is connected to the third alternating-current input connector and the third alternating-current output connector, and is configured to process the first alternating-current voltage to obtain the second alternating-current voltage; and the third alternating-current output connector is connected to the at least one alternating-current device by using the first alternating-current output connector, and is configured to output the second alternating-current voltage to the at least one alternating-current device through the first alternating-current output connector. The alternating-current power module processes the voltage by using the voltage pass-through module, and is connected to the slot in the power module by using the third alternating-current input connector and the third alternating-current output connector, so that the cabinet server is compatible with the alternating-current power module. Therefore, flexible adaptability of the cabinet server is improved.

In an embodiment, the cabinet server further includes a copper busbar, the copper busbar is connected to the first direct-current output connector of the slot, the at least one direct-current device accesses the copper busbar, and when the direct-current power module is inserted into one of the slots in the power module, the direct-current power module is connected to the at least one direct-current device by using the first direct-current output connector and the copper busbar. The direct-current power module supplies power to the at least one direct-current device through the copper busbar in a centralized manner. Therefore, a circuit structure is simplified, effective utilization of a space of the cabinet server is improved, and circuit reliability is ensured.

In an embodiment, the cabinet server further includes at least one power cable, the power module further includes an alternating-current cable connector, the alternating-current cable connector is connected to the first alternating-current output connector of the slot and the power cable, the power cable is connected to the alternating-current device, and when the alternating-current power module is inserted into one of the slots in the power module, the alternating-current power module is connected to the at least one alternating-current device by using the first alternating-current output connector, the alternating-current cable connector, and the power cable. The alternating-current power module supplies power to the at least one alternating-current device through the power cable and the alternating-current cable connector, to ensure power supply stability.

In an embodiment, the power module further includes an access module, the access module is connected to the first alternating-current input connector of the slot, and the access module is configured to receive the three-phase alternating-current voltage input from the outside of the cabinet server, and output the first alternating-current voltage to the direct-current power module and/or the alternating-current power module through the first alternating-current input connector.

In an embodiment, the cabinet server is an entire cabinet server, an entire cabinet, or a device cabinet, the at least one direct-current device is a server node, and the at least one alternating-current device is a switch.

BRIEF DESCRIPTION OF DRAWINGS

To describe the technical solutions in the embodiments of this application or the background more clearly, the following describes the accompanying drawings required in the embodiments of this application or the background.

DESCRIPTION OF EMBODIMENTS

A cabinet server may use a centralized power supply manner. However, in this manner, only a 48 V direct-current voltage can be provided, and an alternating-current voltage or a high direct-current voltage cannot be provided. When a switch is deployed in the cabinet server, a 220 V alternating-current voltage is usually used for the switch, and a 48 V direct-current voltage is used for fewer models. Consequently, the cabinet server has poor versatility. If a power distribution unit (PDU) is placed separately to provide the 220 V alternating-current voltage, a 380 V three-phase alternating-current voltage needs to be input separately. Consequently, a height space of the cabinet server is wasted, a quantity of deployed server nodes is reduced, and density is decreased. The cabinet server may alternatively use a built-in PDU power supply manner. However, because centralized power supply cannot be implemented in this manner, to ensure power supply backup reliability, two power supplies need to be provided to the server for power supply, resulting in high costs of overall power supply deployment. In addition, the PDU supplies power in a power cable manner. When a quantity of servers is large, it is difficult to route the power cables, and maintenance is difficult. To resolve the foregoing technical problems, the embodiments of this application provide the following solutions.

Figure 1:
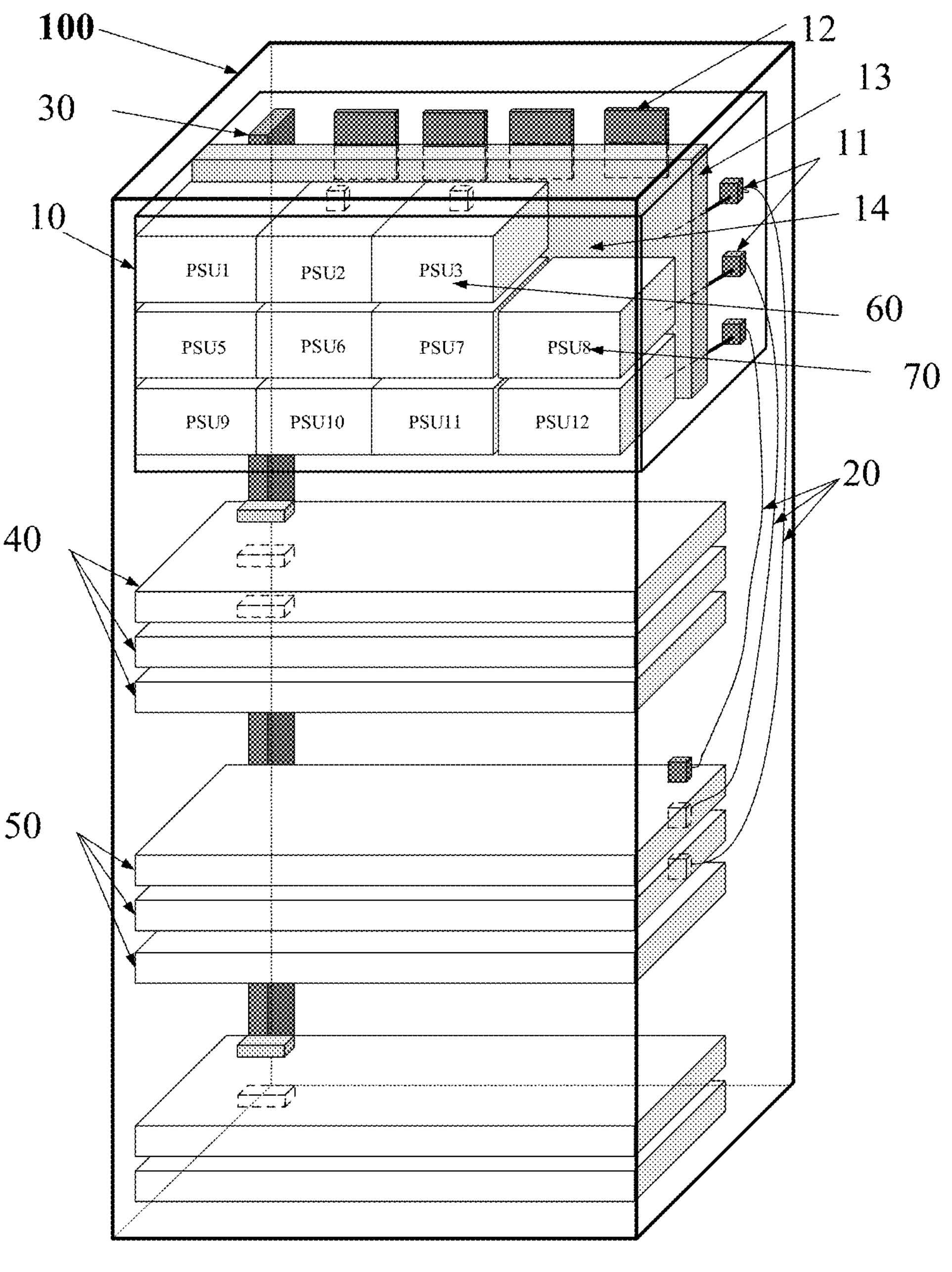
FIG. 1 is a schematic diagram of a cabinet server 100 according to an embodiment of this application.

Referring to FIG. 1, FIG. 1 is a schematic diagram of a cabinet server 100 according to an embodiment of this application. The cabinet server 100 includes a power module 10, at least one direct-current device 40, at least one alternating-current device 50, a direct-current power module 60, and an alternating-current power module 70.

The power module 10 is configured for the direct-current power module 60 and/or the alternating-current power module 70 to be inserted, and the power module 10 is configured to receive a three-phase alternating-current voltage input from the outside of the cabinet server, and output a first alternating-current voltage to the direct-current power module 60 and/or the alternating-current power module 70.

When the direct-current power module 60 is inserted into the power module 10, the direct-current power module 60 is connected to the at least one direct-current device 40 by using the power module 10, and the direct-current power module 60 is configured to provide a first direct-current voltage to the at least one direct-current device 40.

When the alternating-current power module 70 is inserted into the power module 10, the alternating-current power module 70 is connected to the at least one alternating-current device 50 by using the power module 10, and the alternating-current power module 70 is configured to provide a second alternating-current voltage to the at least one alternating-current device 50.

The first alternating-current voltage may be 220 V, or may be another alternating-current voltage value. The first direct-current voltage may be a 48 V direct-current voltage, or may be another direct-current voltage value. The second alternating-current voltage may be a 220 V alternating-current voltage, or may be another alternating-current voltage value. The direct-current device 40 may be a 48 V direct-current device, or may be a direct-current device that supports another voltage. The alternating-current device 50 may be a 220 V alternating-current device, or may be an alternating-current device that supports another voltage.

At least one server node and/or at least one switch may be mounted in the cabinet server 100, for example, an entire cabinet server, an entire cabinet, or a device cabinet. The server node may be, for example, a rack server, a blade server, or a tower server. The server node is usually the direct-current device 40 that uses direct-current power supply (for example, a 48 V direct current (DC)). The switch is usually the alternating-current device 50 that uses alternating-current power supply (for example, a 220 V alternating current (AC)), or alternating-current devices of some models each may be the direct-current device 40 that uses direct-current power supply (for example, a 48 V DC). That is, the cabinet server 100 may compatibly supply power to the direct-current device 40 (for example, the server node) that uses direct-current power supply and the alternating-current device 50 (for example, the switch) that uses alternating-current power supply.

Further, referring to FIG. 1, the cabinet server 100 further includes a power cable 20 and a copper busbar 30.

When the direct-current power module 60 is inserted into the power module 10, the direct-current power module 60 is connected to the copper busbar 30, the copper busbar 30 is connected to the at least one direct-current device 40, and the direct-current power module 60 is configured to provide the first direct-current voltage to the at least one direct-current device 40. When the alternating-current power module 70 is inserted into the power module 10, the alternating-current power module 70 is connected to the power cable 20, the power cable 20 is connected to the at least one alternating-current device 50, and the alternating-current power module 70 is configured to provide the second alternating-current voltage to the at least one alternating-current device 50. In this way, the cabinet server 100 can compatibly supply power to the direct-current device 40 and the alternating-current device 50. Therefore, device versatility in the cabinet server is enhanced.

The power module 10 includes an alternating-current cable connector 11, an access module 12, and a power backplane 13. The power module 10 further includes a plurality of slots 14 (for example, N PSU slots) therein. One direct-current power module 60 or alternating-current power module 70 may be inserted into each slot 14 (described below as PSU slot 14). The direct-current power module 60 or the alternating-current power module 70 may be a power supply unit (PSU). The alternating-current cable connector 11, the access module 12, and the plurality of PSU slots 14 are all located on the power backplane 13. Each of the N PSU slots 14 corresponds to one alternating-current cable connector 11. Optionally, each of some of the N PSU slots 14 corresponds to one alternating-current cable connector 11. N may be an integer greater than 0.

The access module 12 is configured to be input the three-phase alternating-current voltage (for example, a 380 V alternating-current voltage) from the outside of the cabinet server 100, and to output the single-phase first alternating-current voltage to the direct-current power module 60 and/or the alternating-current power module 70.

When the direct-current power module 60 is inserted into a PSU slot 14 in the power module 10, an input terminal of the direct-current power module 60 is connected to the access module 12, an output terminal of the direct-current power module 60 is connected to the copper busbar 30, and the copper busbar 30 is connected to the at least one direct-current device 40. The direct-current power module 60 is configured to receive the first alternating-current voltage output by the access module 12, convert the first alternating-current voltage into the first direct-current voltage, and output the first direct-current voltage to the at least one direct-current device 40 through the copper busbar 30. It should be noted that the copper busbar 30 may receive first direct-current voltages output by all direct-current power modules 60, and output the first direct-current voltages to the at least one direct-current device 40 in a centralized manner. Therefore, a circuit structure is simplified, effective utilization of a space of the cabinet server is improved, and circuit reliability is ensured.

When the alternating-current power module 70 is inserted into a PSU slot 14 of the power module 10, an input terminal of the alternating-current power module 70 is connected to the access module 12, an output terminal of the alternating-current power module 70 is connected to the alternating-current cable connector 11, and the alternating-current cable connector 11 is connected to the alternating-current device 50 by using the power cable 20. The alternating-current power module 70 is configured to receive the first alternating-current voltage output by the access module 12, and output the second alternating-current voltage to the alternating-current device 50. The second alternating-current voltage may be the same as the first alternating-current voltage. For example, both the first alternating-current voltage and the second alternating-current voltage may be 220 V alternating-current voltages. Alternatively, the second alternating-current voltage may be different from the first alternating-current voltage. For example, the first alternating-current voltage may be a 220 V alternating-current voltage, and the second alternating-current voltage may be a 110 V alternating-current voltage.

Figure 2:
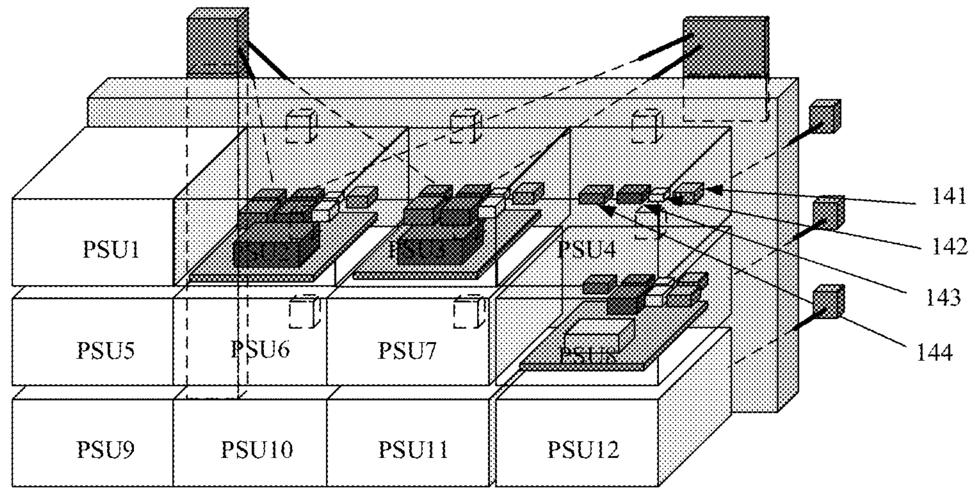
FIG. 2 is a schematic diagram of a structure of a power module 10 according to an embodiment of this application.

Referring to FIG. 2, FIG. 2 is a schematic diagram of a structure of a power module 10 according to an embodiment of this application. The power module 10 includes a plurality of PSU slots 14, and each PSU slot 14 includes a first alternating-current output connector 141, a first control signal connector 142, a first alternating-current input connector 143, and a first direct-current output connector 144. The first alternating-current output connector 141 is connected to the alternating-current cable connector 11, the first direct-current output connector 144 is connected to the copper busbar 30, and the first alternating-current input connector 143 is connected to the access module 12. Optionally, the power module 10 may further include a control module (not shown), and the first control signal connector 142 is connected to the control module.

The first alternating-current output connector 141, the first control signal connector 142, the first alternating-current input connector 143, and the first direct-current output connector 144 in the PSU slot 14 are configured to: when the direct-current power module 60 is inserted into the PSU slot 14, the first control signal connector 142, the first alternating-current input connector 143, and the first direct-current output connector 144 are all connected to the direct-current power module 60; or when the alternating-current power module 70 is inserted into the PSU slot 14, the first alternating-current output connector 141, the first control signal connector 142, and the first alternating-current input connector 143 are all connected to the alternating-current power module 70.

Figure 3:
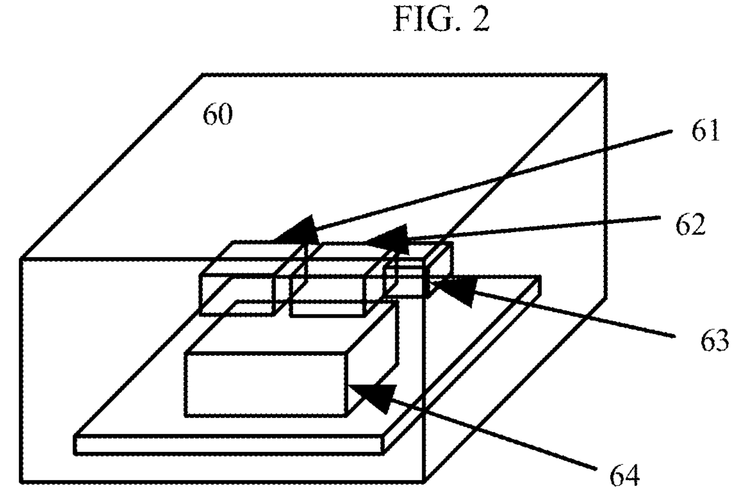
FIG. 3 is a schematic diagram of a structure of a direct-current power module 60 according to an embodiment of this application.

Referring to FIG. 3, FIG. 3 is a schematic diagram of a structure of a direct-current power module 60 according to an embodiment of this application. The direct-current power module 60 includes a second direct-current output connector 61, a second alternating-current input connector 62, a second control signal connector 63, and a voltage conversion module 64. The voltage conversion module 64 is separately connected to the second direct-current output connector 61, the second alternating-current input connector 62, and the second control signal connector 63. The second alternating-current input connector 62 (used as the input terminal of the direct-current power module 60) is connected to the access module 12 by using the first alternating-current input connector 143 in the PSU slot 14, and the second alternating-current input connector 62 is configured to receive, through the first alternating-current input connector 143 in the PSU slot 14, the first alternating-current voltage output by the access module 12. The voltage conversion module 64 is configured to convert the first alternating-current voltage into the first direct-current voltage, the second direct-current output connector 61 (used as the output terminal of the direct-current power module 60) is connected to the first direct-current output connector 144 in the PSU slot 14, and the second direct-current output connector 61 is configured to output the first direct-current voltage to the direct-current device 40 through the first direct-current output connector 144 in the PSU slot 14 and the copper busbar 30. The second control signal connector 63 is connected to the control module by using the first control signal connector 142 in the PSU slot 14, and the second control signal connector 63 is configured to receive, through the first control signal connector 142 in the PSU slot 14, a control signal output by the control module.

The second alternating-current input connector 62, the second direct-current output connector 61, and the second control signal connector 63 in the direct-current power module 60 may be located on a same side surface of the direct-current power module 60 and correspond to the PSU slot 14, so that the direct-current power module 60 can be inserted into the PSU slot 14 to establish a connection to the PSU slot 14. A position of the second alternating-current input connector 62 in the direct-current power module 60 corresponds to a position of the first alternating-current input connector 143 in the PSU slot 14, a position of the second direct-current output connector 61 in the direct-current power module 60 corresponds to a position of the first direct-current output connector 144 in the PSU slot 14, and a position of the second control signal connector 63 in the direct-current power module 60 corresponds to a position of the first control signal connector 142 in the PSU slot 14. In this way, when the direct-current power module 60 is inserted into the PSU slot 14, the second alternating-current input connector 62 in the direct-current power module 60 is connected to the first alternating-current input connector 143 in the PSU slot 14, the second direct-current output connector 61 is connected to the first direct-current output connector 144, and the second control signal connector 63 establishes a connection with the first control signal connector 142.

When the direct-current power module 60 is inserted into any PSU slot (for example, a PSU3 slot) in the power module 10, the second alternating-current input connector 62 in the direct-current power module 60 is connected to the first alternating-current input connector 143 in the PSU3 slot, so that the input terminal of the direct-current power module 60 is connected to the access module 12, to receive the first alternating-current voltage output by the access module 12. The second direct-current output connector 61 in the direct-current power module 60 is connected to the first direct-current output connector 144 in the PSU3 slot, so that the output terminal of the direct-current power module 60 is connected to the copper busbar 30, and is connected to the at least one direct-current device 40 by using the copper busbar 30, to output the first direct-current voltage to the at least one direct-current device 40. The second control signal connector 63 in the direct-current power module 60 is connected to the first control signal connector 142 in the PSU3 slot, so that the direct-current power module 60 can be connected to the control module in the PSU3 slot, to receive control or adjustment from the control module. The following current path 1 is formed through the foregoing connections.

A current sequentially passes through the access module 12, the first alternating-current input connector 143 in the PSU3 slot 14, the second alternating-current input connector 62 in the direct-current power module 60, the voltage conversion module 64 in the direct-current power module 60, the second direct-current output connector 61 in the direct-current power module 60, the first direct-current output connector 144 in the PSU3 slot 14, the copper busbar 30, and the direct-current device 40. Through the current path 1, the direct-current power module 60 can supply power to the at least one direct-current device 40 through the copper busbar 30 in a centralized manner.

It should be noted that, because a PSU inserted into the PSU3 slot 14 is the direct-current power module 60, the direct-current power module 60 includes the second direct-current output connector 61, the second alternating-current input connector 62, and the second control signal connector 63, which are respectively connected to the corresponding first direct-current output connector 144, first alternating-current input connector 143, and first control signal connector 142 in the PSU3 slot 14. In this case, the direct-current power module 60 supplies power to the direct-current device 40. In this way, the direct-current power module 60 is selected by using the PSU slot 14 to supply power to the direct-current device 40.

Figure 4:
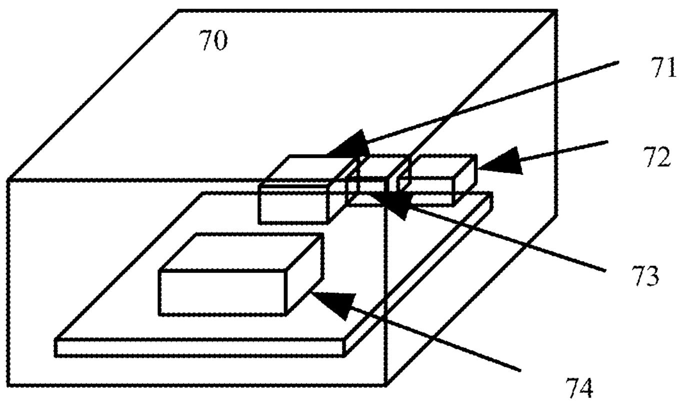
FIG. 4 is a schematic diagram of a structure of an alternating-current power module 70 according to an embodiment of this application.

Referring to FIG. 4, FIG. 4 is a schematic diagram of a structure of an alternating-current power module 70 according to an embodiment of this application. The alternating-current power module 70 includes a third alternating-current input connector 71, a third alternating-current output connector 72, a third control signal connector 73, and a voltage pass-through module 74. The voltage pass-through module 74 is separately connected to the third alternating-current input connector 71, the third alternating-current output connector 72, and the third control signal connector 73. The third alternating-current input connector 71 (used as the input terminal of the alternating-current power module 70) is connected to the access module 12 by using the first alternating-current input connector 143 in the PSU slot 14, and the third alternating-current input connector 71 is configured to receive, through the first alternating-current input connector 143 in the PSU slot 14, the first alternating-current voltage output by the access module 12. The voltage pass-through module 74 is configured to process, for example, turn on or off, the first alternating-current voltage, to obtain the second alternating-current voltage. The third alternating-current output connector 72 (used as the output terminal of the alternating-current power module 70) is connected to the first alternating-current output connector 141 in the PSU slot 14, and the third alternating-current output connector 72 is configured to output the second alternating-current voltage to the alternating-current device 50 through the first alternating-current output connector 141 in the PSU slot 14, the alternating-current cable connector 11, and the power cable 20. The third control signal connector 73 is connected to the control module by using the first control signal connector 142 in the PSU slot 14, and the third control signal connector 73 is configured to receive, through the first control signal connector 142 in the PSU slot 14, a control signal output by the control module. Optionally, the voltage pass-through module 74 is a control switch, configured to control or adjust the output second alternating-current voltage.

The third alternating-current input connector 71, the third alternating-current output connector 72, and the third control signal connector 73 in the alternating-current power module 70 are located on a same side surface of the alternating-current power module 70 and correspond to the PSU slot 14, so that the alternating-current power module 70 can be inserted into the PSU slot 14 to establish a connection to the PSU slot 14. A position of the third alternating-current input connector 71 in the alternating-current power module 70 corresponds to a position of the first alternating-current input connector 143 in the PSU slot 14, a position of the third alternating-current output connector 72 in the alternating-current power module 70 corresponds to a position of the first alternating-current output connector 141 in the PSU slot 14, and a position of the third control signal connector 73 in the alternating-current power module 70 corresponds to a position of the first control signal connector 142 in the PSU slot 14. In this way, when the alternating-current power module 70 is inserted into the PSU slot 14, the third alternating-current input connector 71 in the alternating-current power module 70 is connected to the first alternating-current input connector 143 in the PSU slot 14, the third alternating-current output connector 72 is connected to the first alternating-current output connector 141, and the third control signal connector 73 is connected to the first control signal connector 142.

When the alternating-current power module 70 is inserted into any PSU slot (for example, a PSU8 slot) in the power module 10, the third alternating-current input connector 71 in the alternating-current power module 70 is connected to the first alternating-current input connector 143 in the PSU8 slot, so that the input terminal of the alternating-current power module 70 is connected to the access module 12, to receive the first alternating-current voltage output by the access module 12. The third alternating-current output connector 72 in the alternating-current power module 70 is connected to the first alternating-current output connector 141 in the PSU8 slot, so that the output terminal of the alternating-current power module 70 is connected to the alternating-current cable connector 11, and is connected to the at least one alternating-current device 50 by using the alternating-current cable connector 11, to output the second alternating-current voltage to the at least one alternating-current device 50. The third control signal connector 73 in the alternating-current power module 70 is connected to the first control signal connector 142 in the PSU8 slot, so that the alternating-current power module 70 can be connected to the control module in the PSU8 slot, to receive control or adjustment from the control module. The following current path 2 is formed through the foregoing connections.

A current sequentially passes through the access module 12, the first alternating-current input connector 143 in the PSU8 slot, the third alternating-current input connector 71 in the alternating-current power module 70, the voltage pass-through module 74 in the alternating-current power module 70, the third alternating-current output connector 72 in the alternating-current power module 70, the first alternating-current output connector 141 in the PSU8 slot, the alternating-current cable connector 11, the power cable 20, and the alternating-current device 50. Power is supplied to the at least one alternating-current device 50 through the current path 2.

It should be noted that, because a PSU inserted into the PSU8 slot is the alternating-current power module 70, the alternating-current power module 70 includes the third alternating-current input connector 71, the third alternating-current output connector 72, and the third control signal connector 73, which are respectively connected to the corresponding first alternating-current input connector 143, first alternating-current output connector 141, and first control signal connector 142 in the PSU8 slot. In this case, the alternating-current power module 70 supplies power to the at least one alternating-current device 50. In this way, the alternating-current power module 70 is selected by using the PSU slot 14 to supply power to the alternating-current device 50.

In an embodiment, the power module 10 may further include a control module (not shown), and the first control signal connector 142 in the PSU slot 14 may be connected to the control module. The control module may be a microcontroller unit (MCU), a programmable logic device, or a logic circuit.

When the direct-current power module 60 is inserted into the PSU slot 14, the first control signal connector 142 in the PSU slot 14 is connected to the second control signal connector 63 in the direct-current power module 60, to establish a connection between the direct-current power module 60 and the control module in the power module 10. Alternatively, when the alternating-current power module 70 is inserted into the PSU slot 14, the first control signal connector 142 in the PSU slot 14 is connected to the third control signal connector 73 in the alternating-current power module 70. In this way, a connection between the alternating-current power module 70 and the control module in the power module 10 is established.

In an embodiment, the control module is configured to: send a first signal when the direct-current power module 60 is inserted into the PSU slot 14, where the first signal is used to prompt a user that the PSU inserted into the PSU slot 14 is the direct-current power module 60; and send a second signal when the alternating-current power module 70 is inserted into the PSU slot 14, where the second signal is used to prompt the user that the PSU inserted into the PSU slot 14 is the alternating-current power module 70.

In another embodiment, the control module is configured to receive an input control instruction, and control, according to the control instruction, the direct-current power module 60 or the alternating-current power module 70 to operate. For example, the direct-current power module 16 or the alternating-current power module 70 is controlled to start or stop operating. Alternatively, the first direct-current voltage output by the direct-current power module 60 is adjusted, or the second alternating-current voltage output by the alternating-current power module 70 is adjusted.

In another embodiment, the control module is configured to monitor a running state of the direct-current power module 60 or the alternating-current power module 70, and send alarm information when the direct-current power module 60 or the alternating-current power module 70 abnormally runs. Alternatively, the control module may be further configured to detect a present current, present power consumption, or the like of the direct-current power module 60 or the alternating-current power module 70.

In the foregoing embodiments, the alternating-current power module 70 is connected to the alternating-current cable connector 11 in the power module 10, and the alternating-current cable connector 11 is connected to the power cable 20, to supply power to the alternating-current device 50. In this embodiment, an alternating-current power module 70A is directly connected to a power cable 20A to supply power to an alternating-current device 50A. The following performs detailed description.

Figure 5:
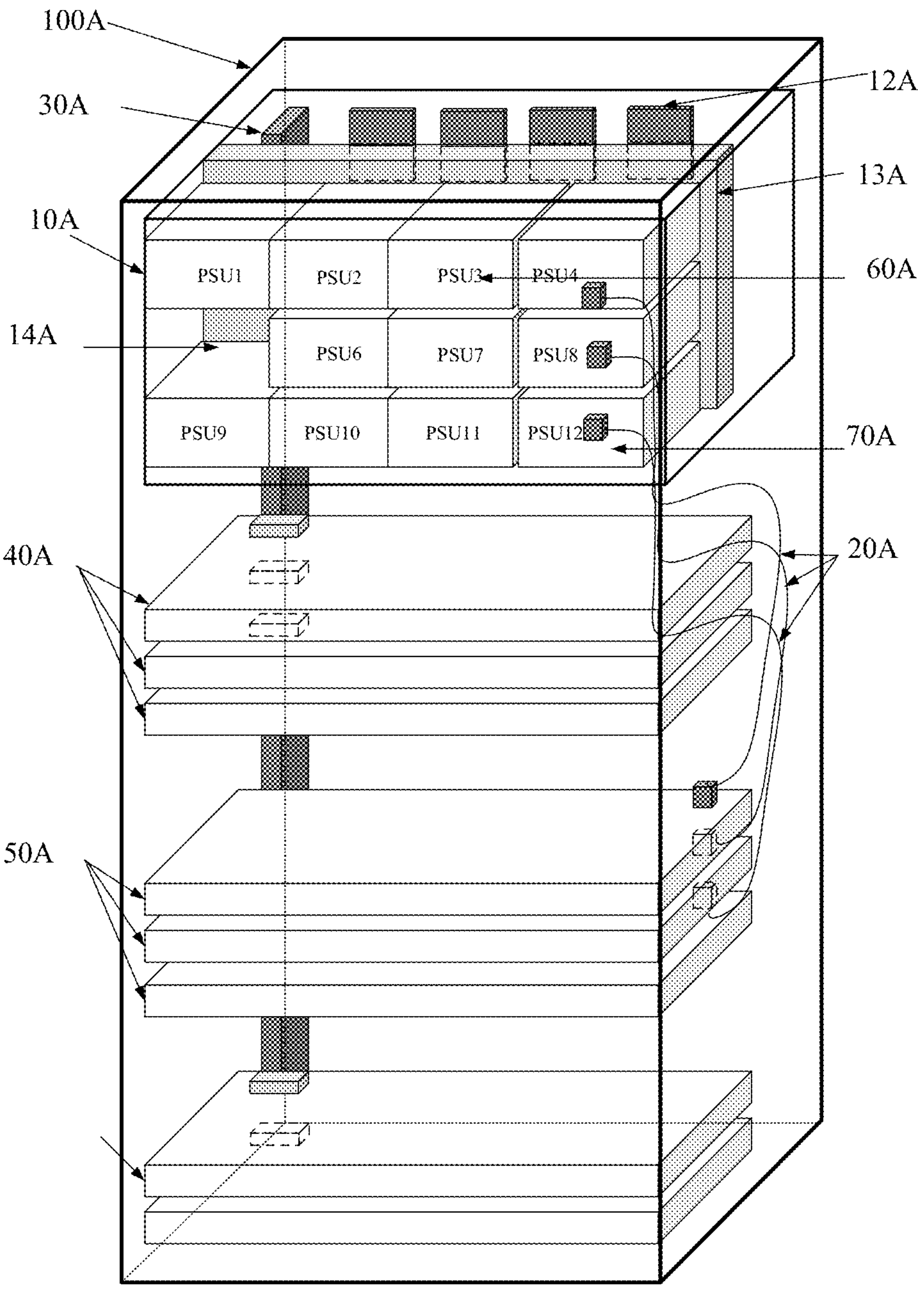
FIG. 5 is a schematic diagram of another cabinet server 100A according to an embodiment of this application.

Referring to FIG. 5, FIG. 5 is a schematic diagram of another cabinet server 100A according to an embodiment of this application. The cabinet server 100A includes a power module 10A, a power cable 20A, a copper busbar 30A, at least one direct-current device 40A, at least one alternating-current device 50A, a direct-current power module 60A, and an alternating-current power module 70A.

The power module 10A includes an access module 12A and a power backplane 13A. The power module 10A further includes a plurality of PSU slots 14A (for example, N PSU slots). One PSU may be inserted into each PSU slot 14A, and the PSU may be the direct-current power module 60A or the alternating-current power module 70A. The access module 12A and the plurality of PSU slots 14A are all located on the power backplane 13A. Different from the power module 10 shown in FIG. 2, the power module 10A does not include the alternating-current cable connector.

The access module 12A is configured to be input a three-phase alternating-current voltage (for example, a 380 V alternating-current voltage) from the outside of the cabinet server 100A, and to output a single-phase first alternating-current voltage to the direct-current power module 60A and/or the alternating-current power module 70A.

When the direct-current power module 60A is inserted into a PSU slot 14A in the power module 10A, an input terminal of the direct-current power module 60A is connected to the access module 12A, an output terminal of the direct-current power module 60A is connected to the copper busbar 30A, and the copper busbar 30A is connected to the at least one direct-current device 40A. The direct-current power module 60A is configured to receive the first alternating-current voltage output by the access module 12A, convert the first alternating-current voltage into a first direct-current voltage, and output the first direct-current voltage to the at least one direct-current device 40A through the copper busbar 30A in a centralized manner. A connection manner of the direct-current power module 60A in this embodiment is the same as a connection manner of the direct-current power module 60 in the foregoing embodiments. Details are not described herein again.

When the alternating-current power module 70A is inserted into a PSU slot 14A in the power module 10A, an input terminal of the alternating-current power module 70A is connected to the access module 12A, an output terminal of the alternating-current power module 70A is directly connected to the power cable 20A, and the power cable 20A is connected to the alternating-current device 50A. The alternating-current power module 70A is configured to receive the first alternating-current voltage output by the access module 12A, and output a second alternating-current voltage to the alternating-current device 50A. A connection manner of the alternating-current power module 70A in this embodiment is different from a connection manner of the alternating-current power module 70 in the foregoing embodiments.

Figure 6:
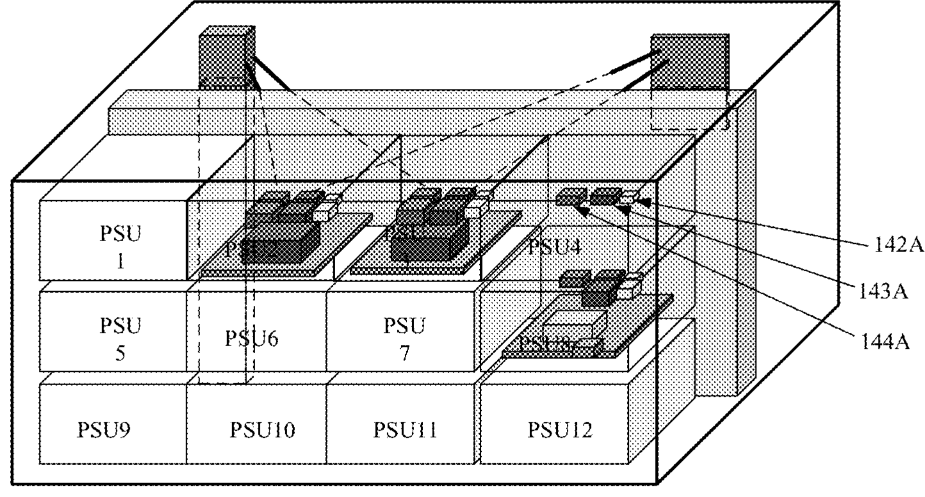
FIG. 6 is a schematic diagram of a structure of a power module 10A according to an embodiment of this application.

Referring to FIG. 6, FIG. 6 is a schematic diagram of a structure of a power module 10A according to an embodiment of this application. The power module 10A includes a plurality of PSU slots 14A, and each PSU slot 14A includes a first control signal connector 142A, a first alternating-current input connector 143A, and a first direct-current output connector 144A. Different from the power module 10 shown in FIG. 2, the power module 10A does not include the first alternating-current output connector.

The first control signal connector 142A, the first alternating-current input connector 143A, and the first direct-current output connector 144A in the PSU slot 14A are configured to: when the direct-current power module 60A is inserted into the PSU slot 14A, the first control signal connector 142A, the first alternating-current input connector 143A, and the first direct-current output connector 144A are all connected to the direct-current power module 60A; or when the alternating-current power module 70A is inserted into the PSU slot 14A, the first control signal connector 142A and the first alternating-current input connector 143A are both connected to the alternating-current power module 70A.

A connection manner of the direct-current power module 60A in this embodiment is the same as a connection manner of the direct-current power module 60 in the foregoing embodiments, and a structure of the direct-current power module 60A is the same as a structure of the direct-current power module 60. In this embodiment, the direct-current power module 60A is not described in detail again. A connection manner of the alternating-current power module 70A in this embodiment is different from a connection manner of the alternating-current power module 70 in the foregoing embodiments, and a structure of the alternating-current power module 70A is different from a structure of the alternating-current power module 70. The following mainly describes the structure of the alternating-current power module 70A.

Figure 7:
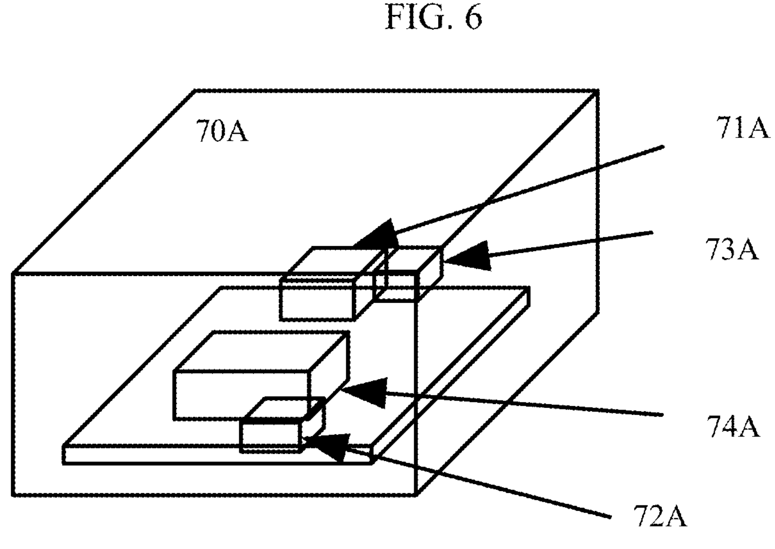
FIG. 7 is a schematic diagram of a structure of an alternating-current power module 70A according to an embodiment of this application.

Referring to FIG. 7, FIG. 7 is a schematic diagram of a structure of an alternating-current power module 70A according to an embodiment of this application. The alternating-current power module 70A includes a third alternating-current input connector 71A, a third alternating-current output connector 72A, a third control signal connector 73A, and a voltage pass-through module 74A. The voltage pass-through module 74A is separately connected to the third alternating-current input connector 71A, the third alternating-current output connector 72A, and the third control signal connector 73A. The third alternating-current input connector 71A (used as the input terminal of the alternating-current power module 70A) is connected to the access module 12A by using the first alternating-current input connector 143A in the PSU slot 14A, and the third alternating-current input connector 71A is configured to receive, through the first alternating-current input connector 143A in the PSU slot 14A, the first alternating-current voltage output by the access module 12A. The voltage pass-through module 74A is configured to process, for example, turn on or off, the first alternating-current voltage, to obtain the second alternating-current voltage. The third alternating-current output connector 72A (used as the output terminal of the alternating-current power module 70A) is directly connected to the power cable 20A, and the third alternating-current output connector 72A is configured to output the second alternating-current voltage to the alternating-current device 50A through the power cable 20A. The third control signal connector 73A is connected to the control module by using the first control signal connector 142A in the PSU slot 14A, and the third control signal connector 73A is configured to receive, through the first control signal connector 142A in the PSU slot 14A, a control signal output by the control module.

The third alternating-current input connector 71A and the third control signal connector 73A in the alternating-current power module 70A are located on a same side surface of the alternating-current power module 70A and correspond to the PSU slot 14A. A position of the third alternating-current input connector 71A in the alternating-current power module 70A corresponds to a position of the first alternating-current input connector 143A in the PSU slot 14A, and a position of the third control signal connector 73A in the alternating-current power module 70A corresponds to a position of the first control signal connector 142A in the PSU slot 14A. In this way, when the alternating-current power module 70A is inserted into the PSU slot 14A, the third alternating-current input connector 71A in the alternating-current power module 70A is connected to the first alternating-current input connector 143A in the PSU slot 14A, and the third control signal connector 73A is connected to the first control signal connector 142A. In addition, the third alternating-current output connector 72A in the alternating-current power module 70A is located on another side surface of the alternating-current power module 70A, for example, an outermost side of the alternating-current power module 70A. In this way, the third alternating-current output connector 72A in the alternating-current power module 70A is directly connected to the power cable 20A.

When the alternating-current power module 70A is inserted into a certain PSU slot (for example, a PSU8 slot) in the power module 10A, the third alternating-current input connector 71A in the alternating-current power module 70A is connected to the first alternating-current input connector 143A in the PSU8 slot, so that the input terminal of the alternating-current power module 70A is connected to the access module 12A, to receive the first alternating-current voltage output by the access module 12A. The third control signal connector 73A in the alternating-current power module 70A is connected to the first control signal connector 142A in the PSU8 slot, so that the alternating-current power module 70A is connected to the control module in the PSU8 slot, to receive a control signal output by the control module. In addition, the third alternating-current output connector 72A in the alternating-current power module 70A is connected to the power cable 20A, so that the output terminal of the alternating-current power module 70A is connected to the at least one alternating-current device 50A by using the power cable 20A, to output the second alternating-current voltage to the at least one alternating-current device 50A. The following current path 3 is formed through the foregoing connections.

A current sequentially passes through the access module 12A, the first alternating-current input connector 143A in the PSU8 slot, the third alternating-current input connector 71A in the alternating-current power module 70A, the voltage pass-through module 74A in the alternating-current power module 70A, the third alternating-current output connector 72A in the alternating-current power module 70A, the power cable 20A, and the alternating-current device 50A. Power is supplied to the alternating-current device 50A through the current path 3.

It should be noted that, because a PSU inserted into the PSU8 slot is the alternating-current power module 70A, the alternating-current power module 70A includes the third alternating-current input connector 71A and the third control signal connector 73A, which are respectively connected to the first alternating-current input connector 143A and the first control signal connector 142A in the PSU8 slot. In this case, the alternating-current power module 70A supplies power to the alternating-current device 50A. In this way, the alternating-current power module 70A is selected by using the PSU slot 14A to supply power to the alternating-current device 50A.

Structures and functions of other parts in this embodiment are the same as those in the foregoing embodiments. For the structures and the functions of the other parts in this embodiment, refer to the descriptions in the foregoing embodiments. Details are not described herein again.

Figure 8:
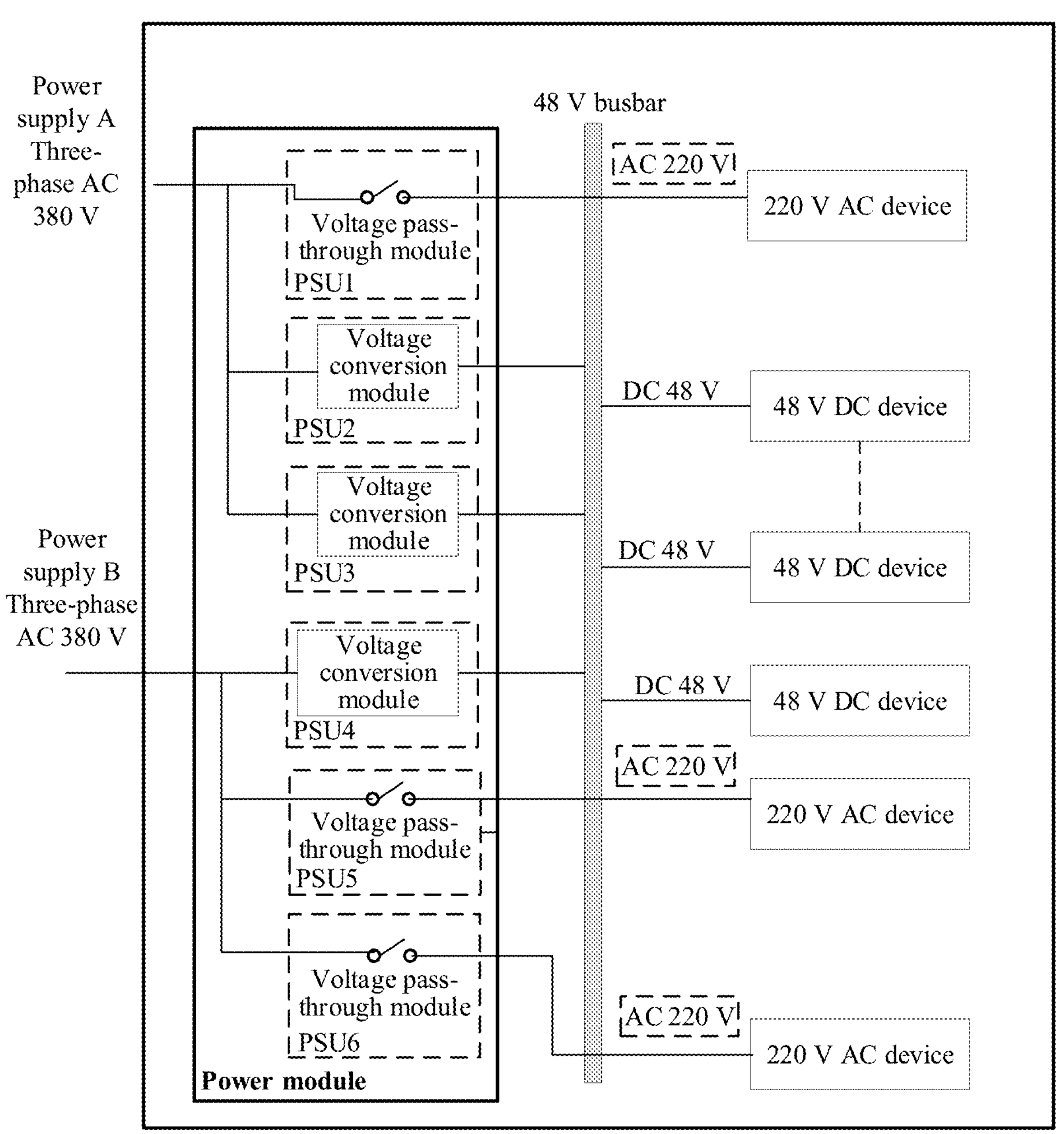
FIG. 8 is a schematic diagram of a power supply manner of a cabinet server according to an embodiment of this application.

Based on the cabinet server 100 provided in FIG. 1 or the cabinet server 100A shown in FIG. 5, FIG. 8 is a schematic diagram of a power supply manner of a cabinet server. The cabinet server may include a power module and a plurality of PSUs. Illustratively, the PSUs may include PSU1, PSU2, PSU3, PSU4, PSU5, and PSU6. The power module includes a plurality of PSU slots and one access module (not shown). A PSU may be inserted into each PSU slot. PSU1, PSU5, and PSU6 are alternating-current power modules, and PSU2, PSU3, and PSU4 are direct-current power modules.

The access module receives a 380 V three-phase AC voltage output by a power supply A or a power supply B, and the three-phase AC voltage is divided into a plurality of (for example, three) 220 V single-phase alternating-current voltages. When the direct-current power modules (PSU2, PSU3, and PSU4) are inserted into the PSU slots, input terminals of PSU2, PSU3, and PSU4 are connected to the access module, and output terminals of PSU2, PSU3, and PSU4 are connected to 48 V DC devices by using a copper busbar. PSU2, PSU3, and PSU4 receive the 220 V alternating-current voltages that are output by the access module; the 220 V alternating-current voltages are converted into 48 V direct-current voltages by using voltage conversion modules in PSU2, PSU3, and PSU4, and the 48 V direct-current voltages are output to the copper busbar; and the copper busbar supplies power to the 48 V DC devices in the cabinet server in a centralized manner. When the alternating-current power modules (PSU1, PSU5, and PSU6) are inserted into the PSU slots, input terminals of PSU1, PSU5, and PSU6 are connected to the access module, and output terminals of PSU1, PSU5, and PSU6 are connected to 220 V AC devices. PSU1, PSU5, and PSU6 receive the 220 V alternating-current voltages that are output by the access module, and voltage pass-through modules in PSU1, PSU5, and PSU6 supply the 220 V alternating-current voltages to the 220 V AC devices.

In this process, a direct-current power module or an alternating-current power module may be inserted into each PSU slot, to support centralized power supply of the 48 V direct-current voltages or independent power supply of the 220 V alternating-current voltages, so that the cabinet server can compatibly supply power to the 48 V direct-current devices and the 220 V alternating-current devices. In addition, a corresponding quantity of direct-current power modules may be selected to be inserted into the PSU slots based on a quantity of 48 V direct-current devices, and a corresponding quantity of alternating-current power modules may be selected to be inserted into the PSU slots based on a quantity of 220 V alternating-current devices.

In conclusion, the cabinet server is compatible with different PSUs (the direct-current power module or the alternating-current power module), so that power is compatibly supplied to the direct-current device and the alternating-current device. Therefore, device versatility in the cabinet server is enhanced, effective utilization of a space of the cabinet server is improved, deployment costs of the cabinet server are reduced, and flexible adaptability of the cabinet server is improved.

The foregoing descriptions are merely specific implementations of this application, but are not intended to limit the protection scope of this application. Any change or replacement readily figured out by a person skilled in the art within the technical scope disclosed in this application shall fall within the protection scope of this application. Therefore, the protection scope of this application shall be subject to the protection scope of the claims.

What is claimed is:

1. A cabinet server, comprising:

at least one direct-current device;

at least one alternating-current device;

a direct-current power module;

an alternating-current power module; and a power module that is configured for the direct-current power module or the alternating-current power module, or both to be inserted into the power module, and the power module is configured to receive a three-phase alternating-current voltage input from the outside of the cabinet server, and output a first alternating-current voltage to the direct-current power module and/or the alternating-current power module, wherein when the direct-current power module is inserted into the power module, the direct-current power module is connected to the at least one direct-current device by using the power module, and the direct-current power module is configured to provide a first direct-current voltage to the at least one direct-current device, and when the alternating-current power module is inserted into the power module, the alternating-current power module is connected to the at least one alternating-current device by using the power module, and the alternating-current power module is configured to provide a second alternating-current voltage to the at least one alternating-current device.

2. The cabinet server according to claim 1, wherein the power module comprises a plurality of slots, and each slot is configured for the direct-current power module or the alternating-current power module to be inserted, and wherein when the direct-current power module is inserted into one of the slots in the power module, an output terminal of the direct-current power module is connected to the at least one direct-current device by using the slot, and when the alternating-current power module is inserted into one of the slots in the power module, an output terminal of the alternating-current power module is connected to the at least one alternating-current device by using the slot.

3. The cabinet server according to claim 2, wherein at least one of the slots in the power module comprises a first alternating-current output connector, a first alternating-current input connector, and a first direct-current output connector, and wherein when the direct-current power module is inserted into the slot in the power module, both the first alternating-current input connector and the first direct-current output connector are connected to the direct-current power module, and when the alternating-current power module is inserted into the slot in the power module, both the first alternating-current output connector and the first alternating-current input connector are connected to the alternating-current power module.

4. The cabinet server according to claim 2, wherein at least one of the slots in the power module comprises a first alternating-current input connector and a first direct-current output connector, and wherein when the direct-current power module is inserted into the slot in the power module, both the first alternating-current input connector and the first direct-current output connector are connected to the direct-current power module, and when the alternating-current power module is inserted into the slot in the power module, the first alternating-current input connector is connected to the alternating-current power module.

5. The cabinet server according to claim 3, wherein the direct-current power module comprises a second direct-current output connector, a second alternating-current input connector, and a voltage conversion module, wherein the second alternating-current input connector is connected to the first alternating-current input connector, and is configured to receive the first alternating-current voltage through the first alternating-current input connector, the voltage conversion module is connected to the second alternating-current input connector and the second direct-current output connector, and is configured to convert the first alternating-current voltage into the first direct-current voltage, and the second direct-current output connector is connected to the at least one direct-current device by using the first direct-current output connector, and is configured to output the first direct-current voltage to the at least one direct-current device through the first direct-current output connector.

6. The cabinet server according to claim 3, wherein the alternating-current power module comprises a third alternating-current input connector, a third alternating-current output connector, and a voltage pass-through module, wherein the third alternating-current input connector is connected to the first alternating-current input connector, and is configured to receive the first alternating-current voltage through the first alternating-current input connector, the voltage pass-through module is connected to the third alternating-current input connector and the third alternating-current output connector, and is configured to process the first alternating-current voltage to obtain the second alternating-current voltage, and the third alternating-current output connector is connected to the at least one alternating-current device by using the first alternating-current output connector, and is configured to output the second alternating-current voltage to the at least one alternating-current device through the first alternating-current output connector.

7. The cabinet server according to claim 3, wherein the cabinet server further comprises a copper busbar, the copper busbar is connected to the first direct-current output connector of the slot, the at least one direct-current device accesses the copper busbar, and when the direct-current power module is inserted into one of the slots in the power module, the direct-current power module is connected to the at least one direct-current device by using the first direct-current output connector and the copper busbar.

8. The cabinet server according to claim 3, wherein the cabinet server further comprises at least one power cable, the power module further comprises an alternating-current cable connector, the alternating-current cable connector is connected to the first alternating-current output connector of the slot and the power cable, the power cable is connected to the alternating-current device, and when the alternating-current power module is inserted into one of the slots in the power module, the alternating-current power module is connected to the at least one alternating-current device by using the first alternating-current output connector, the alternating-current cable connector, and the power cable.

9. The cabinet server according to claim 3, wherein the power module further comprises an access module, the access module is connected to the first alternating-current input connector of the slot, and the access module is configured to receive the three-phase alternating-current voltage input from the outside of the cabinet server, and output the first alternating-current voltage to the direct-current power module or the alternating-current power module, or both, through the first alternating-current input connector.

10. The cabinet server according to claim 1, wherein the cabinet server comprises an entire cabinet server, an entire cabinet, or a device cabinet, and wherein the at least one direct-current device is a server node, and wherein the at least one alternating-current device is a switch.

11. A data center comprising one or more cabinet servers, the one or more cabinet servers comprising:

at least one direct-current device;

at least one alternating-current device;

a direct-current power module;

an alternating-current power module; and a power module that is configured for the direct-current power module or the alternating-current power module, or both to be inserted into the power module, and the power module is configured to receive a three-phase alternating-current voltage input from the outside of the cabinet server, and output a first alternating-current voltage to the direct-current power module and/or the alternating-current power module, wherein when the direct-current power module is inserted into the power module, the direct-current power module is connected to the at least one direct-current device by using the power module, and the direct-current power module is configured to provide a first direct-current voltage to the at least one direct-current device, and when the alternating-current power module is inserted into the power module, the alternating-current power module is connected to the at least one alternating-current device by using the power module, and the alternating-current power module is configured to provide a second alternating-current voltage to the at least one alternating-current device.

12. The data center according to claim 11, wherein the power module comprises a plurality of slots, and each slot is configured for the direct-current power module or the alternating-current power module to be inserted, and wherein when the direct-current power module is inserted into one of the slots in the power module, an output terminal of the direct-current power module is connected to the at least one direct-current device by using the slot, and when the alternating-current power module is inserted into one of the slots in the power module, an output terminal of the alternating-current power module is connected to the at least one alternating-current device by using the slot.

13. The data center according to claim 12, wherein at least one of the slots in the power module comprises a first alternating-current output connector, a first alternating-current input connector, and a first direct-current output connector, and wherein when the direct-current power module is inserted into the slot in the power module, both the first alternating-current input connector and the first direct-current output connector are connected to the direct-current power module, and when the alternating-current power module is inserted into the slot in the power module, both the first alternating-current output connector and the first alternating-current input connector are connected to the alternating-current power module.

14. The data center according to claim 12, wherein at least one of the slots in the power module comprises a first alternating-current input connector and a first direct-current output connector, and wherein when the direct-current power module is inserted into the slot in the power module, both the first alternating-current input connector and the first direct-current output connector are connected to the direct-current power module, and when the alternating-current power module is inserted into the slot in the power module, the first alternating-current input connector is connected to the alternating-current power module.

15. The data center according to claim 13, wherein the direct-current power module comprises a second direct-current output connector, a second alternating-current input connector, and a voltage conversion module, wherein the second alternating-current input connector is connected to the first alternating-current input connector, and is configured to receive the first alternating-current voltage through the first alternating-current input connector, the voltage conversion module is connected to the second alternating-current input connector and the second direct-current output connector, and is configured to convert the first alternating-current voltage into the first direct-current voltage, and the second direct-current output connector is connected to the at least one direct-current device by using the first direct-current output connector, and is configured to output the first direct-current voltage to the at least one direct-current device through the first direct-current output connector.

16. The data center according to claim 13, wherein the alternating-current power module comprises a third alternating-current input connector, a third alternating-current output connector, and a voltage pass-through module, wherein the third alternating-current input connector is connected to the first alternating-current input connector, and is configured to receive the first alternating-current voltage through the first alternating-current input connector, the voltage pass-through module is connected to the third alternating-current input connector and the third alternating-current output connector, and is configured to process the first alternating-current voltage to obtain the second alternating-current voltage, and the third alternating-current output connector is connected to the at least one alternating-current device by using the first alternating-current output connector, and is configured to output the second alternating-current voltage to the at least one alternating-current device through the first alternating-current output connector.

17. The data center according to claim 13, wherein the cabinet server further comprises a copper busbar, the copper busbar is connected to the first direct-current output connector of the slot, the at least one direct-current device accesses the copper busbar, and when the direct-current power module is inserted into one of the slots in the power module, the direct-current power module is connected to the at least one direct-current device by using the first direct-current output connector and the copper busbar.

18. The data center according to claim 13, wherein the cabinet server further comprises at least one power cable, the power module further comprises an alternating-current cable connector, the alternating-current cable connector is connected to the first alternating-current output connector of the slot and the power cable, the power cable is connected to the alternating-current device, and when the alternating-current power module is inserted into one of the slots in the power module, the alternating-current power module is connected to the at least one alternating-current device by using the first alternating-current output connector, the alternating-current cable connector, and the power cable.

19. The data center according to claim 13, wherein the power module further comprises an access module, the access module is connected to the first alternating-current input connector of the slot, and the access module is configured to receive the three-phase alternating-current voltage input from the outside of the cabinet server, and output the first alternating-current voltage to the direct-current power module or the alternating-current power module, or both, through the first alternating-current input connector.

20. A server, housed within a server cabinet, wherein the server cabinet comprises:

at least one direct-current device;

at least one alternating-current device;

a direct-current power module;

an alternating-current power module; and a power module that is configured for the direct-current power module or the alternating-current power module, or both to be inserted into the power module, and the power module is configured to receive a three-phase alternating-current voltage input from the outside of the cabinet server, and output a first alternating-current voltage to the direct-current power module and/or the alternating-current power module, wherein when the direct-current power module is inserted into the power module, the direct-current power module is connected to the at least one direct-current device by using the power module, and the direct-current power module is configured to provide a first direct-current voltage to the at least one direct-current device, and when the alternating-current power module is inserted into the power module, the alternating-current power module is connected to the at least one alternating-current device by using the power module, and the alternating-current power module is configured to provide a second alternating-current voltage to the at least one alternating-current device.

* * * * *